(12) United States Patent
Lee et al.

(10) Patent No.: US 12,502,684 B2
(45) Date of Patent: Dec. 23, 2025

(54) SUBSTRATE TREATMENT APPARATUS HAVING HEATING PART

(71) Applicant: DEVICE CO., LTD., Cheonan-si (KR)

(72) Inventors: Taek Youb Lee, Cheonan-si (KR); Jun Hwan Lee, Cheonan-si (KR); Man Je Bang, Cheonan-si (KR)

(73) Assignee: DEVICE CO., LTD., Chungcheongnam-do (KR)

( * ) Notice: Subject to any disclaimer, the term of this patent is extended or adjusted under 35 U.S.C. 154(b) by 128 days.

(21) Appl. No.: 18/424,018

(22) Filed: Jan. 26, 2024

(65) Prior Publication Data

US 2025/0091076 A1    Mar. 20, 2025

(30) Foreign Application Priority Data

Sep. 15, 2023  (KR) .................... 10-2023-0123246

(51) Int. Cl.
*B05B 13/02* (2006.01)
*B05B 7/00* (2006.01)
*B05B 7/16* (2006.01)

(52) U.S. Cl.
CPC ........ *B05B 13/0228* (2013.01); *B05B 7/0075* (2013.01); *B05B 7/16* (2013.01)

(58) Field of Classification Search
CPC ...... B05B 13/0228; B05B 7/16; B05B 7/0075
See application file for complete search history.

(56) References Cited

U.S. PATENT DOCUMENTS

| | | | |
|---|---|---|---|
| 9,245,777 B2 | 1/2016 | Plazonic et al. | |
| 10,658,204 B2 * | 5/2020 | Hill | H01L 21/67115 |
| 10,720,343 B2 * | 7/2020 | Mui | H01L 21/67051 |
| 11,043,403 B2 * | 6/2021 | Kim | H01L 21/68728 |
| 2002/0051644 A1 * | 5/2002 | Sugimoto | H01L 21/67028 396/564 |
| 2014/0090669 A1 * | 4/2014 | Hinode | H01L 21/30604 134/105 |
| 2014/0231013 A1 * | 8/2014 | Hinode | H01L 21/67051 156/345.23 |
| 2014/0339215 A1 * | 11/2014 | Plazonic | H01L 21/68792 219/443.1 |

(Continued)

FOREIGN PATENT DOCUMENTS

| | | |
|---|---|---|
| JP | 200632701 A | 2/2006 |
| KR | 1020150066289 A | 6/2015 |

(Continued)

*Primary Examiner* — Benjamin L Osterhout
(74) *Attorney, Agent, or Firm* — BLANK ROME LLP

(57) ABSTRACT

The present disclosure relates to a substrate treatment apparatus including: a chuck base connected to a driving shaft in such a way as to be rotatable together with the driving shaft and having a spin chuck with chuck pins disposed on top thereof to support a substrate and a chuck support part; a fluid supply unit for supplying treatment liquid to an upper surface of the substrate; a back nozzle assembly mounted through a hollow portion formed at the center of the chuck base to spray treatment liquid onto a lower surface of the substrate; cover glass disposed between the spin chuck and the back nozzle assembly; a heating part disposed between the spin chuck and the back nozzle assembly in a space between the cover glass and the chuck support part; and a heat sink contacting a lower surface of the heating part.

6 Claims, 6 Drawing Sheets

(56) References Cited

U.S. PATENT DOCUMENTS

| | | | |
|---|---|---|---|
| 2015/0034133 A1* | 2/2015 | Kim | H01L 21/67051 |
| | | | 134/105 |
| 2016/0013079 A1* | 1/2016 | Choi | H01L 21/67051 |
| | | | 156/345.21 |
| 2016/0300727 A1 | 10/2016 | Hinode et al. | |
| 2017/0043379 A1* | 2/2017 | Sasaki | H01L 21/6708 |
| 2017/0256433 A1* | 9/2017 | Hammer | H01L 21/67051 |
| 2018/0002811 A1* | 1/2018 | Motomatsu | C23C 18/163 |
| 2018/0047596 A1* | 2/2018 | Si | H01L 21/67034 |
| 2019/0198363 A1 | 6/2019 | Shimai et al. | |
| 2019/0311923 A1* | 10/2019 | Kim | H01L 21/6708 |
| 2019/0318946 A1* | 10/2019 | Kim | H01L 21/67115 |
| 2020/0075355 A1* | 3/2020 | Kwon | H01L 21/67115 |
| 2022/0319905 A1 | 10/2022 | Song et al. | |

FOREIGN PATENT DOCUMENTS

| | | | | | |
|---|---|---|---|---|---|
| KR | 1020170131779 A | | 11/2017 | | |
| KR | 20230029174 A | * | 3/2023 | ....... | H01L 21/68792 |
| TW | 201513250 A | | 4/2015 | | |
| TW | 202240743 A | | 10/2022 | | |

* cited by examiner

SUBSTRATE TREATMENT APPARATUS HAVING HEATING PART

BACKGROUND OF THE DISCLOSURE

Cross Reference to Related Application of the Disclosure

The present application claims the benefit of Korean Patent Application No. 10-2023-0123246 filed in the Korean Intellectual Property Office on Sep. 15, 2023, the entire contents of which are incorporated herein by reference.

FIELD OF THE DISCLOSURE

The present disclosure relates to a substrate treatment apparatus having a heating part, more specifically to a substrate treatment apparatus having a heating part that is capable of heating a substrate to achieve improvement of productivity and a reduction in the amount of treatment liquids used.

BACKGROUND OF THE RELATED ART

Generally, a substrate treatment apparatus is an apparatus that performs, with the use of treatment liquids, various processes such as deposition, photolithography, etching, and cleaning for substrates such as semiconductor wafers, substrates for display, optical disk substrates, magnetic disk substrates, photomask substrates, ceramic substrates, solar cell substrates, and the like.

Among the processes, the cleaning process is carried out to remove foreign substances or particles from the substrate, and representatively, a treatment liquid is supplied to an upper surface or a lower surface of a substrate to perform the cleaning process for the substrate, while the substrate is rotating at a high speed in a state of being supportedly placed on top of a chuck base (spin head).

In this case, a heating part is located under the substrate to allow the substrate to be heated to a given temperature, and next, if the heated substrate rotates so that it is subjected to a given treatment, a reaction occurs fast to reduce the amount of a treatment liquid used. Further, the environmental contamination caused by the application of the treatment liquid is minimized, and the time required for the treatment is shortened to achieve improvement of productivity and a reduction in the quantity of electricity consumed.

Various technologies and studies of a substrate treatment apparatus capable of rotating the substrate in a state where the substrate is heated have been proposed and developed.

If LEDs or IR lamps as components of the heating part are used, further, the heating part is sealed by means of cover glass to prevent a printed circuit board from being contaminated by the treatment liquid.

However, if the heat generated from the heating part is accumulated due to the sealing structure, the neighboring components as well as the heating part can be deteriorated badly in durability. Therefore, heat emission has to be sufficiently performed to prevent such a problem from occurring.

In the conventional technologies, a cooling path is additionally formed under the heating part to flow cooling gas therealong, but the cooling path is complicated in configuration. Further, the cooling path is not brought into contact with the heating part, and accordingly, only the convection of the cooling gas is used, which reduces a cooling efficiency for the heating part.

In the conventional technologies, moreover, the treatment liquid leaks to the space between the cover glass and the chuck base, thereby causing the heating part to be malfunctioned.

SUMMARY OF THE DISCLOSURE

Accordingly, the present disclosure has been made in view of the above-mentioned problems occurring in the related art, and it is an object of the present disclosure to provide a substrate treatment apparatus having a heating part that is capable of improving a cooling efficiency for the heating part to provide excellent durability and preventing the heating part from being malfunctioned due to the introduction of a treatment liquid into the heating part.

To accomplish the above-mentioned objects, according to the present disclosure, there is provided a substrate treatment apparatus having a heating part, including: a chuck base connected to a driving shaft in such a way as to be rotatable together with the driving shaft and having a ring-shaped spin chuck with chuck pins disposed on top thereof to support a substrate and a chuck support part located on the lower portion of the inner peripheral surface of the spin chuck; a fluid supply unit for supplying treatment liquid to an upper surface of the substrate; a back nozzle assembly mounted through a hollow portion formed at the center of the chuck base to spray treatment liquid onto a lower surface of the substrate; a cover glass disposed between the spin chuck and the back nozzle assembly; the heating part disposed between the spin chuck and the back nozzle assembly in a space between the cover glass and the chuck support part; and a heat sink contacting a lower surface of the heating part.

According to the present disclosure, desirably, the heat sink may have a cooling water path located therein to flow cooling water therealong.

According to the present disclosure, desirably, when viewed in plan view, the cooling water path may have an inlet and an outlet located inside the driving shaft in such a way as to be connected to a cooling water circulation line extended to the outside of the substrate treatment apparatus.

According to the present disclosure, desirably, when viewed in plan view, the cooling water path may include: a first cooling water path and a second cooling water path located on both sides of the heat sink with respect to one straight line passing through the center of the driving shaft; and a connection cooling water path located on the outermost position of the heat sink in a radial direction to connect the first cooling water path and the second cooling water path to each other.

According to the present disclosure, desirably, the back nozzle assembly may include: a plurality of purge gas spray holes formed spaced apart from each other around the periphery of the back nozzle assembly, the plurality of purge gas spray holes being located above the heating part; and a first purge gas supply path located therein in such a way as to communicate with the purge gas spray holes.

According to the present disclosure, desirably, the back nozzle assembly may include: a coupling groove formed on the outer peripheral surface thereof to insert the cover glass thereinto; and a second purge gas supply path located therein in such a way as to communicate to the coupling groove.

According to the present disclosure, desirably, a top surface of the coupling groove and a portion of a top surface of the cover glass facing the top surface of the coupling groove are inclined upward toward a center of the driving shaft.

According to the present disclosure, desirably, the heating part and the heat sink may be configured to move in upward and downward directions.

BRIEF DESCRIPTION OF THE DRAWINGS

The above and other objects, features and advantages of the present disclosure will be apparent from the following detailed description of the embodiments of the disclosure in conjunction with the accompanying drawings, in which.

DETAILED DESCRIPTION OF THE PREFERRED EMBODIMENT

Figure 1:
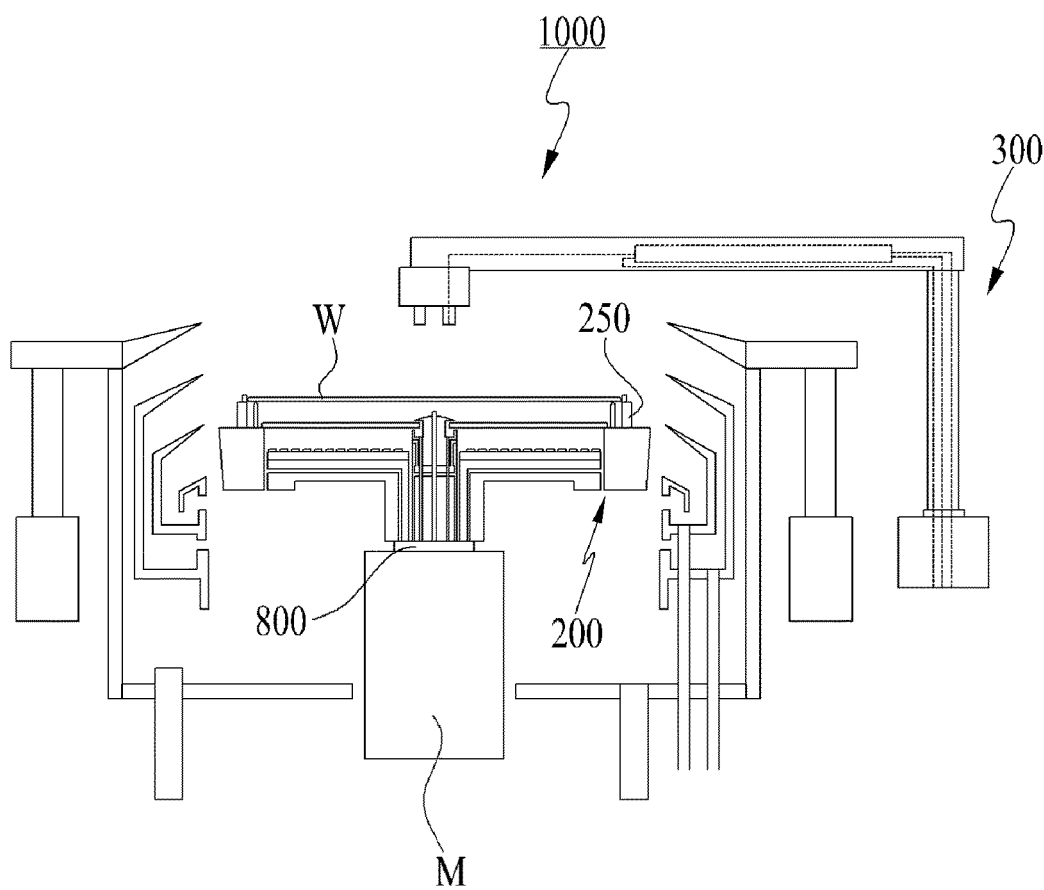
FIG. 1 is a front sectional view showing a substrate treatment apparatus according to the present disclosure.

Hereinafter, an embodiment of the present disclosure will be explained in detail with reference to the attached drawings.

As shown in FIGS. 1 to 4, a substrate treatment apparatus 1000 according to the present disclosure includes: a chuck base 200 connected to a driving shaft 800 that is driven by a motor M in such a way as to be rotatable together with the driving shaft 800 and having a ring-shaped spin chuck 210 with chuck pins 250 disposed on top thereof to support a substrate W and a chuck support part 220 located on the lower portion of the inner peripheral surface of the spin chuck 210; a fluid supply unit 300 for supplying treatment liquid to an upper surface of the substrate W; a back nozzle assembly 400 mounted through a hollow portion 240 formed at the center of the chuck base 200 to spray treatment liquid onto a lower surface of the substrate W; cover glass 500 disposed between the spin chuck 210 and the back nozzle assembly 400; a heating part 600 disposed between the spin chuck 210 and the back nozzle assembly 400 in a space between the cover glass 500 and the chuck support part 220; and a heat sink 700 contacting a lower surface of the heating part 600.

When viewed in plan view, the spin chuck 210 has the shape of the ring, and when the circular substrate W is installed on the spin chuck 210 and rotates, accordingly, the spin chuck 210 desirably has no weight unbalance with the substrate W in a circumferential direction thereof.

The heating part 600 includes heaters 610 such as LEDS, IR lamps, and the like and a printed circuit board 620 on which the heaters 610 are mounted, and accordingly, various parameters such as turning on/off, intensity of light, and the like are controlled by the control functions of the printed circuit board 620.

Further, the heating part 600 is fixedly coupled to the back nozzle assembly 400, coupled relatively rotatable thereto, or movable up and down with respect to the back nozzle assembly 400.

In this case, the printed circuit board 620 of the heating part 600 is desirably located inside the spin chuck 210 and has the outer periphery facing the inner periphery of the spin chuck 210 so that the substrate W is uniformly heated.

However, if the plurality of heaters 610 are located in pre-intended arrangements, the printed circuit board 620 may not be limited specially in shape.

Further, the cover glass 500 is configured to prevent the treatment liquid sprayed from the back nozzle assembly 400 from entering the spin chuck 210 and the back nozzle assembly 400 so that the treatment liquid sprayed from the back nozzle assembly 400 is not introduced into the heating part 600.

To do this, the outer peripheral surface of the cover glass 500 and the neighboring region thereof are fixedly coupled to top of the spin chuck 210 in such a way as to come into close contact therewith, thereby preventing the treatment liquid from entering the heating part 600.

Further, the back nozzle assembly 400 is configured as a non-rotary part, and the cover glass 500 is fixed to the spin chuck 210 and thus provided as a rotary part, so that the inner peripheral surface of the cover glass 500 and the neighboring region thereof are inserted into a coupling groove 470 as will be discussed later of the back nozzle assembly 400 to prevent the treatment liquid from entering the back nozzle assembly 400 by means of purge gas spraying.

The cover glass 500 desirably has the shape of a circle to avoid weight unbalance in the circumferential direction thereof, while having installation grooves 510 at which the chuck pins 250 are located.

The heat sink 700 contacts the lower surface of the heating part 600 and thus serves to emit the heat generated from the heating part 600 to the outside.

The heat sink 700 is made of a material having excellent thermal conductivity such as aluminum so that it can emit the heat fast.

Figure 2:
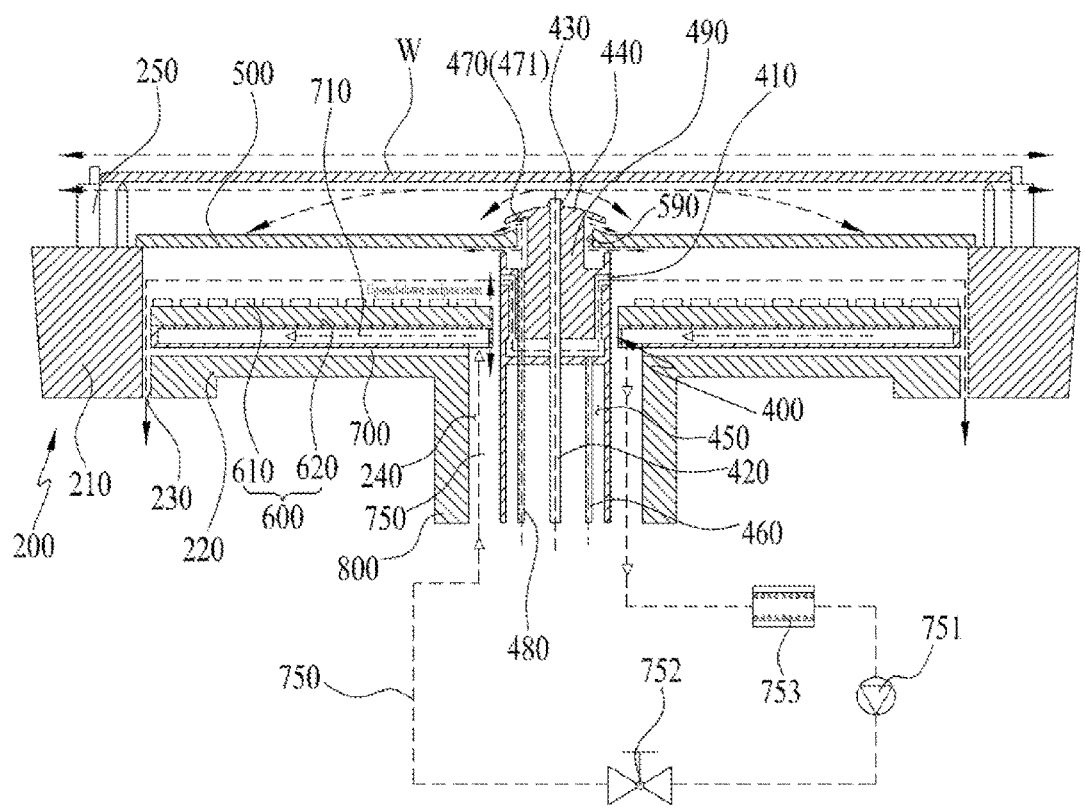
FIG. 2 is a front sectional view showing main parts of FIG. 1.
Figure 3:
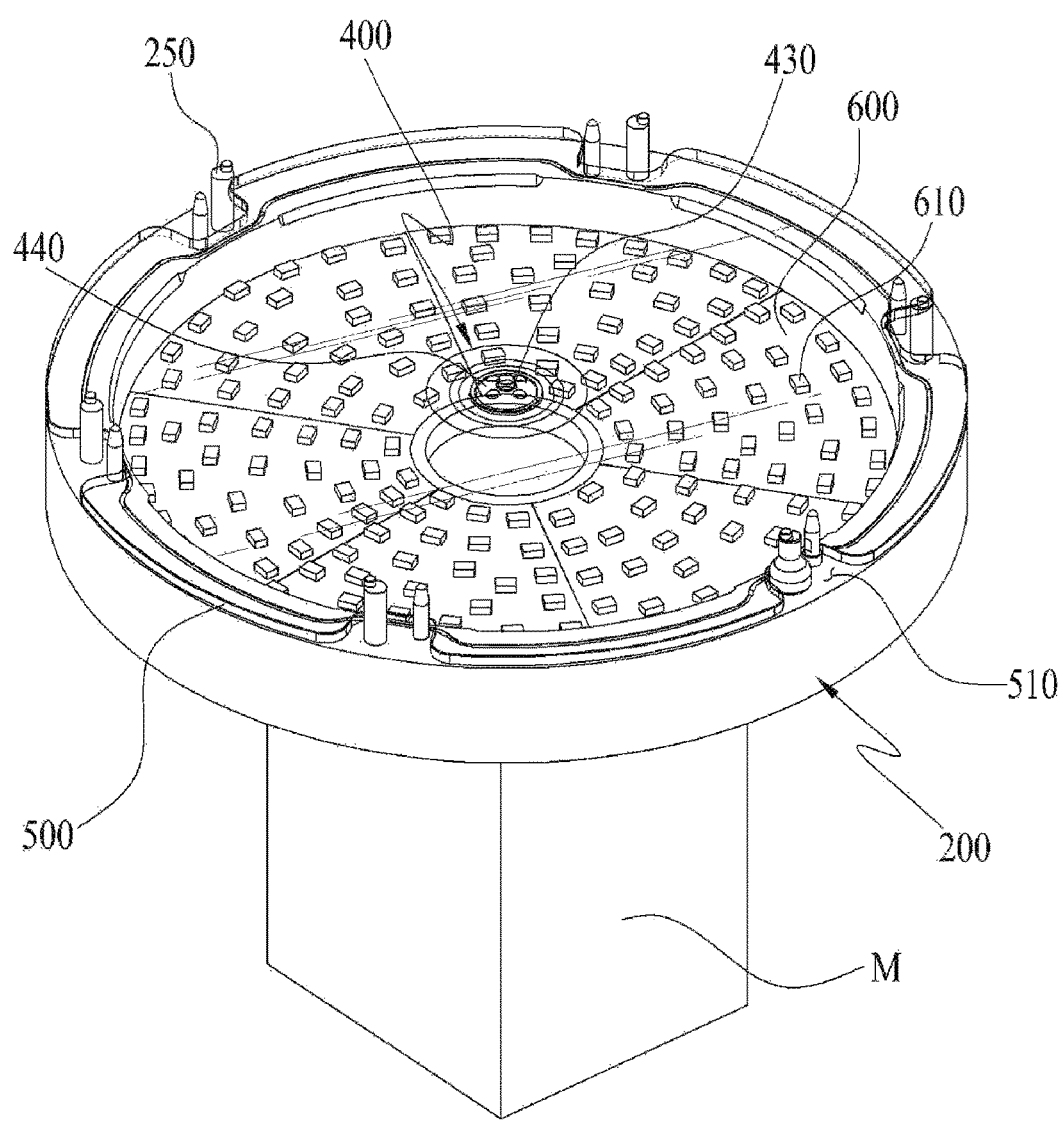
FIG. 3 is a perspective view showing main parts of the substrate treatment apparatus according to the present disclosure.
Figure 4:
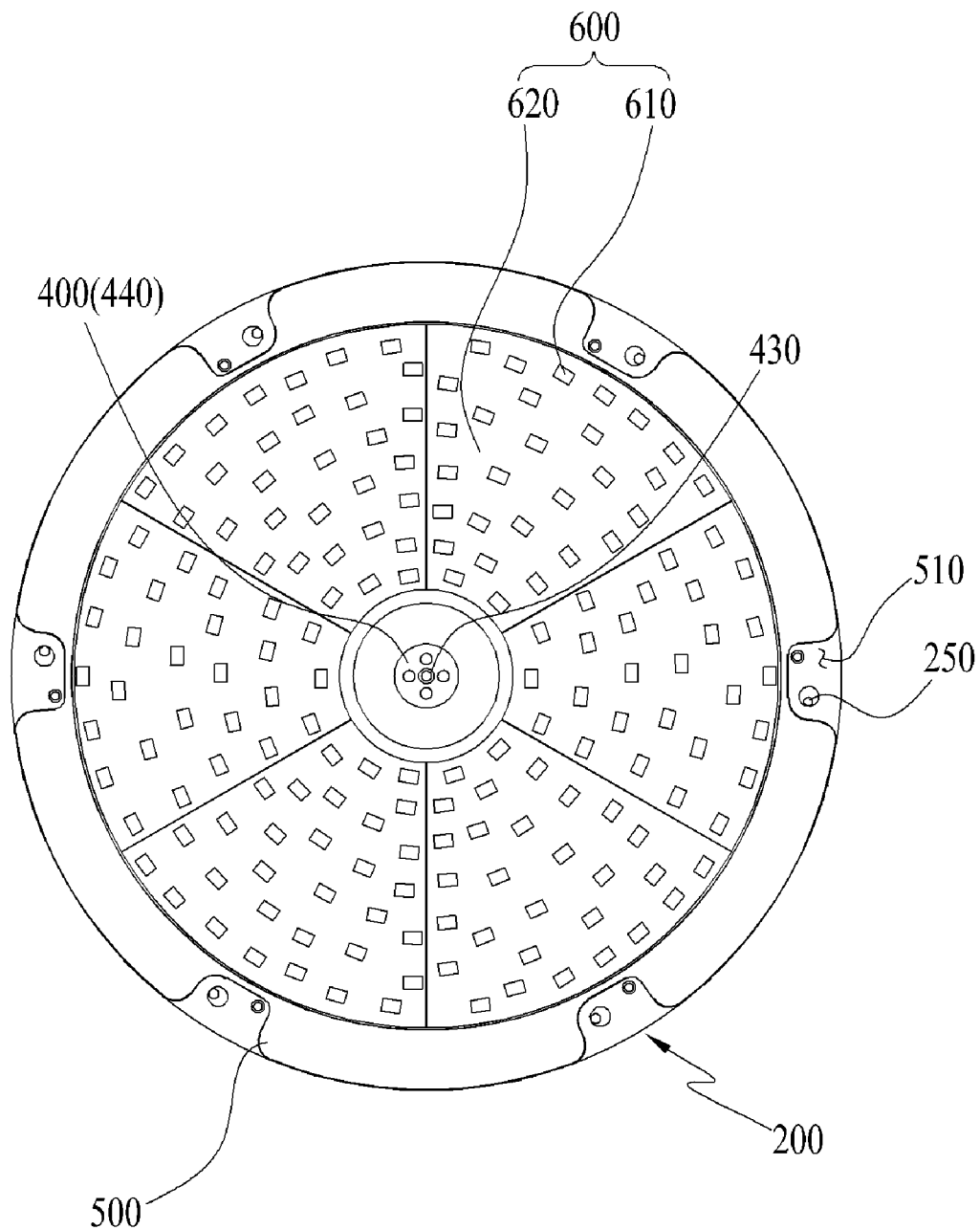
FIG. 4 is a plan view of FIG. 3.
Figure 5:
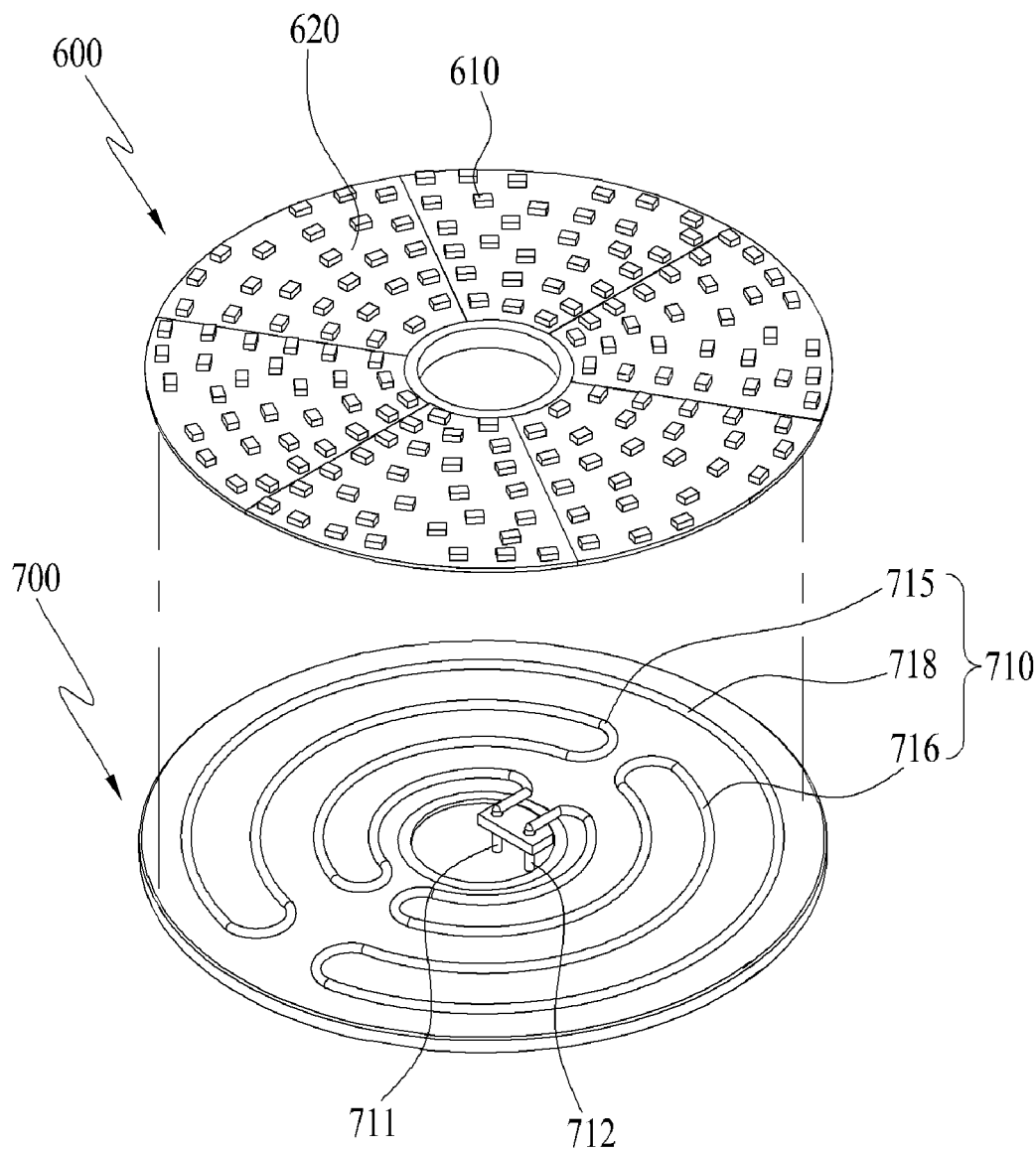
FIG. 5 is an exploded perspective view showing a heating part and a heat sink of the substrate treatment apparatus according to the present disclosure.

Further, as shown in FIGS. 2 and 5, the heat sink 700 has a cooling water path 710 located therein to flow cooling water therealong so that the heat of the heat sink 700 is emitted to relatively cold outside through the cooling water path 710.

When viewed in plan view, desirably, the cooling water path 710 has an inlet 711 and an outlet 712 located inside the driving shaft 800 in such a way as to be connected to a cooling water circulation line 750 extended to the outside of the substrate treatment apparatus 1000.

In detail, the cooling water circulation line 750 has a pump 751 and a valve 752 mounted thereon to appropriately control an amount of cooling water flowing according to the intensity of the heating part 600, so that the cooling water is flowing inside the heat sink 700, thereby emitting the heat of the heat sink 700 to the outside.

If the cooling water circulation line 750 further includes a heat exchanger 753, the cooling water, which becomes colder by means of the heat exchanger 753, is supplied toward the heating part 600, thereby enhancing the heat emission effect.

The cooling water circulation line 750 extends to the outside through a space between the driving shaft 800 and the outer periphery of the back nozzle assembly 400, thereby preventing the exposure to the outside and the interference with the surrounding structures.

The cooling water circulation line 750 ensures a high cooling efficiency and reduces the amount of cooling water consumed unnecessarily.

When viewed in plan view, the cooling water path 710 includes a first cooling water path 715 and a second cooling water path 716 located on both sides of the heat sink 700 with respect to one straight line passing through the center of the driving shaft 800 and a connection cooling water path 718 located on the outermost position of the heat sink 700 in a radial direction to connect the first cooling water path 715 and the second cooling water path 716 to each other.

Under such a configuration, the cooling water starts to flow around the driving shaft 800, uniformly moves the half of the heating part 600 through the first cooling water path 715 to emit the heat generated from the heating part 600, and uniformly moves the rest half of the heating part 600 through the second cooling water path 716 to emit the heat generated from the heating part 600.

When viewed from above the substrate, the cooling water path 710 is a continuous meandering path with the shapes of arches formed locally, but it may not be limited specially in shape.

For example, the cooling water path 710 has a double spiral path extending spirally toward the outside in a radial direction and reducing spirally again toward the inside so that the inlet 711 and the outlet 712 are connected to the cooling water circulation line 750 located inside the driving shaft 800.

The heating part 600 and the heat sink 700 are configured to be movable in upward and downward directions.

After the high temperature treatment through the heating part 600 has been performed, accordingly, the heating part 600 and the heat sink 700 move down to prevent their residual heat from being transferred to the substrate W.

That is, the heaters 610 and the printed circuit board 620 are cooled through the cooling water flowing inside the heat sink 700, and further, the heaters 610 themselves are spaced apart from the substrate W fast to avoid their residual heat from being transferred to the substrate W and adversely affected to the substrate W.

To perform the high temperature treatment, of course, the heating part 600 and the heat sink 700 move up to given positions fast.

To allow the heating part 600 and the heat sink 700 to be configured to be movable in the upward and downward directions, a pneumatic or hydraulic cylinder is connected to them.

Figure 6:
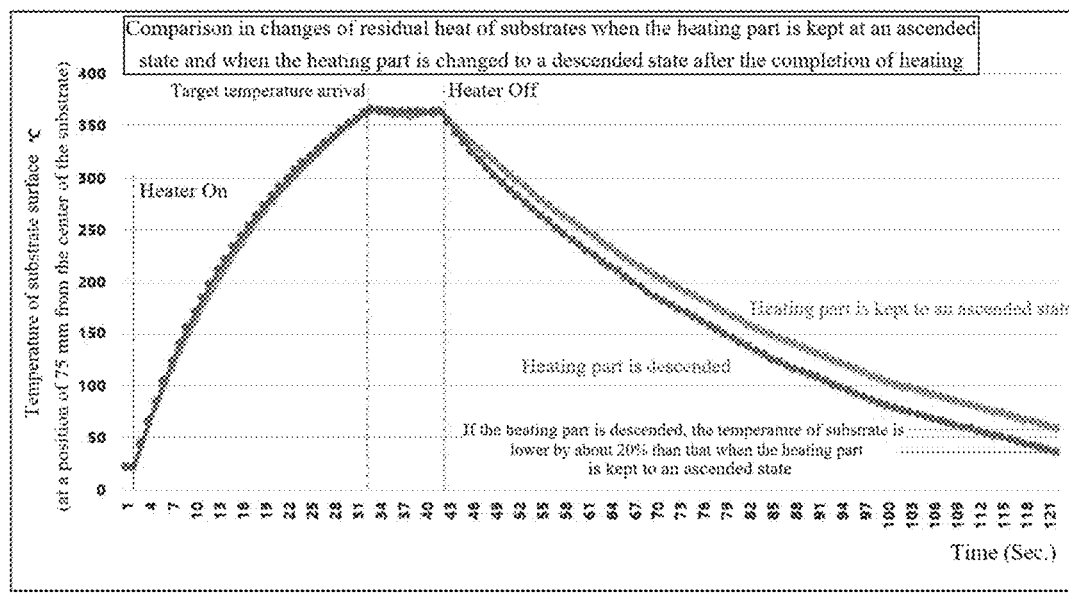
FIG. 6 is a graph showing the comparison in changes of residual heat of substrates when the heating part is kept at an ascended state and when the heating part is changed to a descended state after a high temperature treatment has been performed by the heating part.

FIG. 6 is a graph showing the comparison in changes of residual heat of the substrates W when the heating part 600 is kept at an ascended state and when the heating part 600 is changed to a descended state after the high temperature treatment has been performed by the heating part 600.

In this case, the residual heat of the substrate W is measured at a position of 75 mm in a radial direction from the center of the substrate W.

As shown, if the heating part 600 is descended, the residual heat of the substrate W exists lower by about 20% than that when the heating part 600 is kept to an ascended state.

The back nozzle assembly 400 has a plurality of purge gas spray holes 410 formed spaced apart from each other around its periphery, the plurality of purge gas spray holes 410 being located above the heating part 600.

Accordingly, purge gas is sprayed from the purge gas spray holes 410 and passes over the heating part 600, so that a convection phenomenon occurs to allow the heating part 600 to be additionally cooled.

The purge gas passing over the heating part 600 is exhausted to the outside through a first gap 230 between the spin chuck 210 and the chuck support part 220.

In this case, a purge gas collection device may be disposed to collect the purge gas exhausted.

The back nozzle assembly 400 has an accommodation groove 450 formed in a longitudinal (upward and downward) direction thereof, and a first purge gas supply path 460 is located in the longitudinal direction of the accommodation groove 450 in such a way as to communicate with the purge gas spray hole 410.

However, the first purge gas supply path 460 may be connected to the purge gas spray hole 410 by means of appropriate different methods.

The first purge gas supply path 460 is located in the longitudinal direction of the accommodation groove 450 and transfers the purge gas to the purge gas spray hole 410 from a purge gas supply source, which is not shown, located on the outside.

The first purge gas supply path 460 is formed of a pipe, but it may be a path having an arbitrary shape and type that communicates with the purge gas spray hole 410.

The back nozzle assembly 400 has the coupling groove 470 formed on the outer peripheral surface thereof to insert the cover glass 500 thereinto and a second purge gas supply path 480 located therein in such a way as to communicate to the coupling groove 470.

In the same manner as the first purge gas supply path 460, the second purge gas supply path 480 is located in the accommodation groove 450 and formed in the longitudinal direction of the accommodation groove 450 and transfers the purge gas to the coupling groove 470 from the purge gas supply source, which is not shown, located on the outside.

However, the second purge gas supply path 480 may be connected to the coupling hole 470 by means of appropriate different methods.

As a result, as shown in FIG. 2, the purge gas is exhausted through a second gap 471 between the cover glass 500 and the coupling groove 470 to prevent the treatment liquid discharged from the back nozzle assembly 400 from entering the second gap 471 and causing the malfunction of the heating part 600.

As shown, a through hole 590 is formed on the cover glass 500 to pass the back nozzle assembly 400 therethrough. A top surface of the coupling groove 470 and a portion of a top surface of the cover glass 500 facing the top surface of the coupling groove 470 are inclined upward toward a center of the driving shaft 800.

Under such a configuration, the introduction path of the treatment liquid is converted, and simultaneously, the purge gas pressurizes the treatment liquid against the inclined portions, so that the treatment liquid is more effectively prevented from entering the second gap 471.

The second purge gas supply path 480 is formed of a pipe, but it may be a path having an arbitrary shape that communicates with the coupling groove 470.

Moreover, the purge gas spray hole 410 and the coupling groove 470 communicate with each other, and the first purge gas supply path 460 and the second purge gas supply path 480 communicate with each other, so that the purge gas is dividedly supplied to the first purge gas supply path 460 and the second purge gas supply path 480 from one purge gas supply source.

The back nozzle assembly 400 includes a body 490, a treatment liquid supply path 420 located inside the body, a back nozzle 430 connected to the treatment liquid supply path 420, and a nozzle skirt 440 located on top of the body 490 to allow the back nozzle 430 to be formed therein.

The nozzle skirt 440 is detachably coupled to the body 490.

As described above, the substrate treatment apparatus having the heating part according to the present disclosure is configured to have the heating part adapted to transfer heat to the substrate and the heat sink contacting the lower surface of the heating part, so that the heat generated from the heating part is effectively emitted to the outside.

According to the present disclosure, further, the substrate treatment apparatus having the heating part is configured to allow the cooling water path along which cooling water flows to be located inside the heat sink, so that the heat of the heat sink is emitted more effectively to relatively cold outside through the cooling water path.

According to the present disclosure, moreover, the substrate treatment apparatus having the heating part is configured to allow the inlet and the outlet of the cooling water path to be located inside the driving shaft in such a way as to be connected to the cooling water circulation line located on the outside, so that the heat emission effect is enhanced and the amount of cooling water consumed unnecessarily is reduced.

According to the present disclosure, also, the substrate treatment apparatus having the heating part is configured to allow the cooling water path to have the first cooling water path and the second cooling water path located on both sides of the heat sink with respect to one straight line passing through the center of the driving shaft and the connection cooling water path located on the outermost position of the heat sink in a radial direction to connect the first cooling water path and the second cooling water path to each other, so that the cooling water starts to flow around the driving shaft, uniformly moves the half of the heating part through the first cooling water path to emit the heat generated from the heating part, and uniformly moves the rest half of the heating part through the second cooling water path to emit the heat generated from the heating part, thereby upgrading the cooling efficiency.

According to the present disclosure, besides, the substrate treatment apparatus having the heating part is configured to allow the back nozzle assembly to have a plurality of purge gas spray holes formed spaced apart from each other around the periphery of the back nozzle assembly, the plurality of purge gas spray holes being located above the heating part and the first purge gas supply path disposed therein in such a way as to communicate with the purge gas spray holes, so that the purge gas is sprayed from the purge gas spray holes and passes over the heating part, thereby allowing the heating part to be additionally cooled by means of a convection phenomenon.

According to the present disclosure, further, the substrate treatment apparatus having the heating part is configured to allow the back nozzle assembly to have the coupling groove formed on the outer peripheral surface thereof to insert the cover glass thereinto and the second purge gas supply path located therein in such a way as to communicate to the coupling groove, so that the purge gas is exhausted through the second gap between the cover glass and the coupling groove to prevent the treatment liquid discharged from the back nozzle assembly from flowing back through the second gap and causing the malfunction of the heating part.

According to the present disclosure, moreover, the substrate treatment apparatus having the heating part is configured to allow a top surface of the coupling groove and a portion of a top surface of the cover glass facing the top surface of the coupling groove are inclined upward toward a center of the driving shaft, so that the introduction path of the treatment liquid is converted, and simultaneously, the purge gas pressurizes the treatment liquid against the inclined portions, thereby more effectively preventing the treatment liquid from entering the second gap.

According to the present disclosure, also, the substrate treatment apparatus having the heating part is configured to allow the heating part and the heat sink to be configured to be movable in upward and downward directions, so that after the high temperature treatment has been performed through the heating part, the heating part moves down to prevent the residual heat from being transferred to the substrate.

The present disclosure may be modified in various ways and may have several exemplary embodiments. It is therefore intended that the scope of the disclosure be limited not by this detailed description, but rather by the claims appended hereto, and it should be understood that the disclosure covers all the modifications, equivalents, and replacements within the idea and technical scope of the disclosure.

What is claimed is:

1. A substrate treatment apparatus having a heating part, comprising:
    a chuck base connected to a driving shaft in such a way as to be rotatable together with the driving shaft and having a ring-shaped spin chuck with chuck pins disposed on top thereof to support a substrate and a chuck support part located on a lower portion of inner peripheral surface of the spin chuck;
    a fluid supply unit for supplying treatment liquid to an upper surface of the substrate;
    a back nozzle assembly mounted through a hollow portion formed at a center of the chuck base to spray treatment liquid onto a lower surface of the substrate;
    a cover glass disposed between the spin chuck and the back nozzle assembly;
    the heating part disposed between the spin chuck and the back nozzle assembly in a space between the cover glass and the chuck support part; and
    a heat sink contacting a lower surface of the heating part, wherein the heat sink has a cooling water path located therein to flow cooling water therealong.

2. The substrate treatment apparatus according to claim 1, wherein when-viewed from above the substrate, the cooling water path has an inlet and an outlet located inside the driving shaft in such a way as to be connected to a cooling water circulation line.

3. A substrate treatment apparatus having a heating part, comprising:
    a chuck base connected to a driving shaft in such a way as to be rotatable together with the driving shaft and having a ring-shaped spin chuck with chuck pins disposed on top thereof to support a substrate and a chuck support part located on a lower portion of inner peripheral surface of the spin chuck;
    a fluid supply unit for supplying treatment liquid to an upper surface of the substrate;
    a back nozzle assembly mounted through a hollow portion formed at a center of the chuck base to spray treatment liquid onto a lower surface of the substrate;
    a cover glass disposed between the spin chuck and the back nozzle assembly;
    the heating part disposed between the spin chuck and the back nozzle assembly in a space between the cover glass and the chuck support part; and
    a heat sink contacting a lower surface of the heating part, wherein the back nozzle assembly comprises:
    a purge gas spray hole formed on a given longitudinal portion of the back nozzle assembly in a circumference direction thereof above the heating part; and a first purge gas supply path located in the back nozzle assembly in such a way as to communicate with the purge gas spray hole.

4. The substrate treatment apparatus according to claim 3, wherein the back nozzle assembly comprises:
   a coupling groove formed on outer peripheral surface of the back nozzle assembly to insert the cover glass thereinto; and
   a second purge gas supply path located in the back nozzle assembly in such a way as to communicate to the coupling groove.

5. The substrate treatment apparatus according to claim 4, wherein a top surface of the coupling groove and a portion of a top surface of the cover glass facing the top surface of the coupling groove are inclined upward toward a center of the driving shaft.

6. A substrate treatment apparatus having a heating part, comprising:
   a chuck base connected to a driving shaft in such a way as to be rotatable together with the driving shaft and having a ring-shaped spin chuck with chuck pins disposed on top thereof to support a substrate and a chuck support part located on a lower portion of inner peripheral surface of the spin chuck;
   a fluid supply unit for supplying treatment liquid to an upper surface of the substrate;
   a back nozzle assembly mounted through a hollow portion formed at a center of the chuck base to spray treatment liquid onto a lower surface of the substrate;
   a cover glass disposed between the spin chuck and the back nozzle assembly;
   the heating part disposed between the spin chuck and the back nozzle assembly in a space between the cover glass and the chuck support part; and
   a heat sink contacting a lower surface of the heating part, wherein the heating part and the heat sink are configured to be movable in upward and downward directions.

* * * * *